(12) United States Patent
Kim et al.

(10) Patent No.: US 11,740,073 B2
(45) Date of Patent: Aug. 29, 2023

(54) METHOD FOR MEASURING CD USING SCANNING ELECTRON MICROSCOPE

(71) Applicants: SAMSUNG ELECTRONICS CO., LTD., Suwon-si (KR); SEOUL NATIONAL UNIVERSITY R&DB FOUNDATION, Seoul (KR)

(72) Inventors: Jooho Kim, Seoul (KR); Donyun Kim, Seoul (KR); Yunhyoung Nam, Seoul (KR); Seungjin Lee, Yongin-Si (KR); Dawoon Choi, Hwaseong-Si (KR)

(73) Assignees: SAMSUNG ELECTRONICS CO., LTD., Suwon-si (KR); SEOUL NATIONAL UNIVERSITY R&DB FOUNDATION, Seoul (KR)

(*) Notice: Subject to any disclaimer, the term of this patent is extended or adjusted under 35 U.S.C. 154(b) by 8 days.

(21) Appl. No.: 17/463,499

(22) Filed: Aug. 31, 2021

(65) Prior Publication Data
US 2022/0299315 A1   Sep. 22, 2022

(30) Foreign Application Priority Data
Mar. 18, 2021 (KR) .................. 10-2021-0035249

(51) Int. Cl.
*G01B 11/24* (2006.01)
*H01J 37/28* (2006.01)
(Continued)

(52) U.S. Cl.
CPC ............... *G01B 11/24* (2013.01); *G06T 7/60* (2013.01); *G06V 10/267* (2022.01); *H01J 37/28* (2013.01);
(Continued)

(58) Field of Classification Search
CPC .. H01J 37/00; H01J 37/02; H01J 37/26; H01J 37/28; H01J 2237/24578; H01J 2237/2803; H01J 21/3065; G01B 11/24; G06T 7/60; G06T 7/30; G06V 10/267; G06V 20/693; H01L 22/12
(Continued)

(56) References Cited

U.S. PATENT DOCUMENTS 7,816,062 B2   10/2010   Nagatomo et al.
7,883,633 B2   2/2011    Miyamoto et al.
(Continued)

FOREIGN PATENT DOCUMENTS

KR   10-2008-0027516   3/2008
KR   10-2020-0072474   6/2020
KR   10-2020-0096990   8/2020

*Primary Examiner* — Jason L McCormack
(74) *Attorney, Agent, or Firm* — F. Chau & Associates, LLC

(57) ABSTRACT

A method of measuring a critical dimension (CD) includes forming a plurality of patterns in a substrate, creating first to n-th images, where n is a natural number greater than 1, for first to n-th areas in the substrate, respectively, where the first to n-th areas do not overlap with each other, where each of the first to n-th areas comprising at least some of the plurality of patterns, creating a merged image for the first to n-th images, and measuring a CD for a measurement object from the plurality of patterns using the merged image. The merged image has a higher resolution than each of the first to n-th images.

20 Claims, 7 Drawing Sheets

(51) Int. Cl.
*G06T 7/60* (2017.01)
*G06V 10/26* (2022.01)

(52) U.S. Cl.
CPC ............... *H01J 2237/24578* (2013.01); *H01J 2237/2803* (2013.01)

(58) Field of Classification Search
USPC ........................................ 250/306, 307, 311
See application file for complete search history.

(56) References Cited

U.S. PATENT DOCUMENTS

| | | |
|---|---|---|
| 9,236,219 B2 | 1/2016 | Chen et al. |
| 2007/0105243 A1 | 6/2007 | Nagatomo |
| 2007/0237415 A1 | 10/2007 | Cao et al. |
| 2000/0242760 | 10/2009 | Miyamoto et al. |
| 2009/0242760 A1* | 10/2009 | Miyamoto ............. G01B 15/00 250/311 |
| 2010/0000383 A1* | 1/2010 | Koos .................... G02B 21/367 382/128 |
| 2014/0002829 A1* | 1/2014 | Kim ....................... G01B 11/00 356/629 |
| 2014/0264016 A1 | 9/2014 | Chen et al. |
| 2015/0317508 A1* | 11/2015 | Zheng .................... G02B 27/58 348/80 |
| 2019/0214223 A1 | 7/2019 | Sriraman |
| 2020/6133290 | 6/2020 | Sanguinetti et al. |

\* cited by examiner

METHOD FOR MEASURING CD USING SCANNING ELECTRON MICROSCOPE

CROSS-REFERENCE TO THE RELATED APPLICATION

This application claims priority under 35 USC § 119 from Korean Patent Application No. 10-2021-0035249, filed on Mar. 18, 2021 in the Korean Intellectual Property Office, the contents of which are herein incorporated by reference in their entirety.

BACKGROUND

1. Technical Field

Exemplary embodiments of the disclosure are directed to a method for measuring a critical dimension (CD) using a scanning electron microscope.

2. Discussion of the Related Art

As semiconductor devices become more highly integrated, a semiconductor microstructure that has high accuracy and high uniformity is needed. As semiconductor device design rules have been reduced, the importance of measuring the critical dimension (CD) of a micropattern of the semiconductor device has increased. A scanning electron microscope can produce an image of a pattern of a semiconductor device, and a CD can be measured through the produced image.

SUMMARY

Exemplary embodiments of the disclosure provide a critical dimension (CD) measurement method capable of reducing a CD measurement error upon measuring a CD.

A method of measuring a CD according to an exemplary embodiment of the disclosure includes forming a plurality of patterns in a substrate, creating first to n-th images, where n is a natural number greater than 1, for first to n-th areas in the substrate, respectively, where the first to n-th areas do not overlap with each other, and each of the first to n-th areas includes at least some of the plurality of patterns, creating a merged image from the first to n-th images, and measuring a CD of a measurement object from the plurality of patterns using the merged image. The merged image has higher resolution than each of the first to n-th images.

A method of measuring a critical dimension (CD) according to an exemplary embodiment of the disclosure includes forming a plurality of patterns in a substrate, creating first to n-th images, where n is a natural number greater than 1, for first to n-th areas in the substrate, respectively, where the first to n-th areas do not overlap with each other, and each of the first to n-th areas includes at least some of the plurality of patterns, creating a merged image from the first to n-th images, and measuring a CD of a measurement object from the plurality of patterns using the merged image. Creating the first to n-th images includes scanning each of the first to n-th areas using a scanning electron microscope in a first scanning direction. Measuring the CD includes measuring a CD for the measurement object in a second direction. The substrate includes a plurality of chip areas separated by a scribe lane. The first to n-th areas are included in different chip areas, respectively. The merged image has higher resolution than each of the first to n-th images.

A method of measuring a CD according to an exemplary embodiment of the disclosure includes forming a plurality of patterns in a substrate, creating first to n-th images, where n is a natural number greater than 1, for first to n-th areas in the substrate, respectively, where the first to n-th areas do not overlap with each other, and each of the first to n-th areas includes at least some of the plurality of patterns, creating a merged image from the first to n-th images, and measuring a CD of a measurement object from the plurality of patterns using the merged image. The substrate includes a plurality of chip areas separated by a scribe lane. Respective relative positions of the first to n-th areas in the different chip areas are identical. The merged image has higher resolution than each of the first to n-th images.

DETAILED DESCRIPTION OF EXEMPLARY EMBODIMENTS

Figure 1:
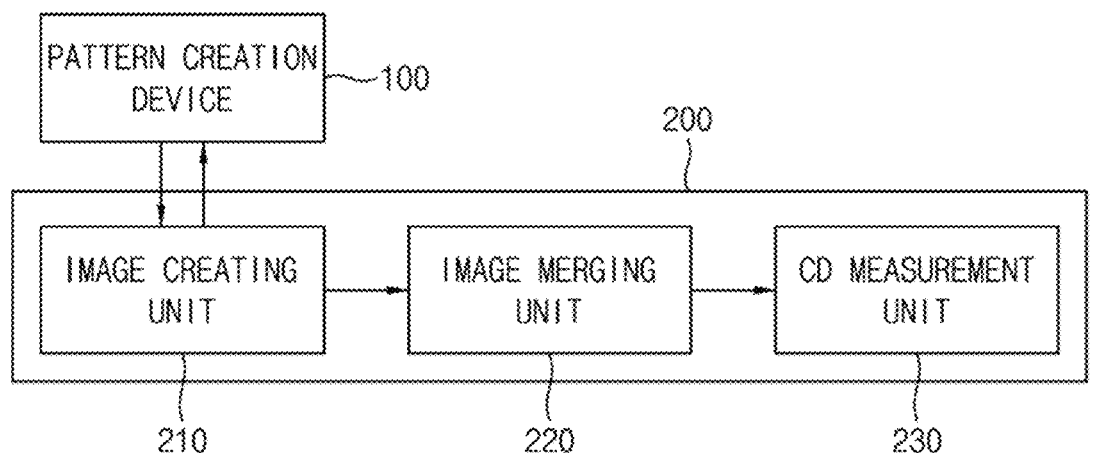
FIG. 1 is a block diagram of a critical dimension (CD) measurement system according to an exemplary embodiment of the disclosure.
Figure 2:
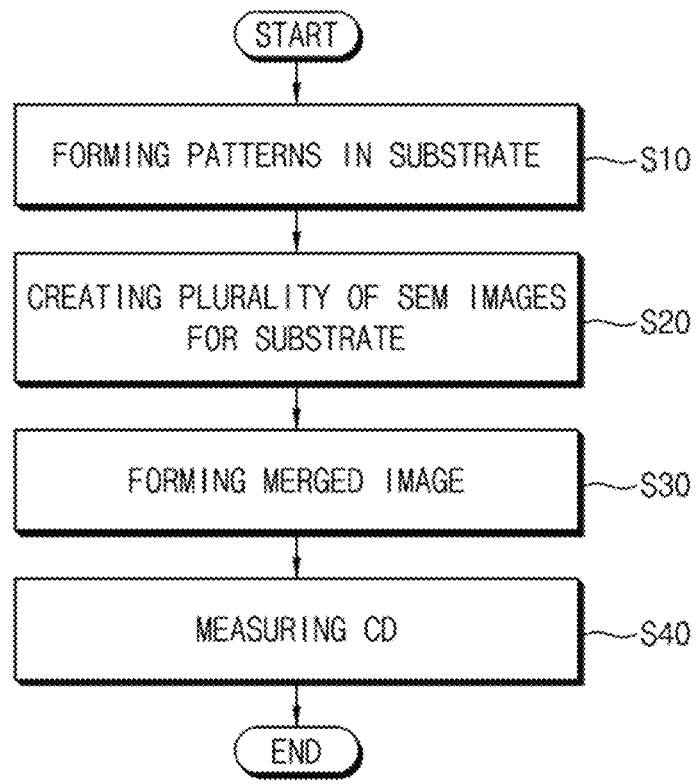
FIG. 2 is a flowchart of a method for measuring a CD through a CD measurement system according to an exemplary embodiment of the disclosure.
Figure 3:
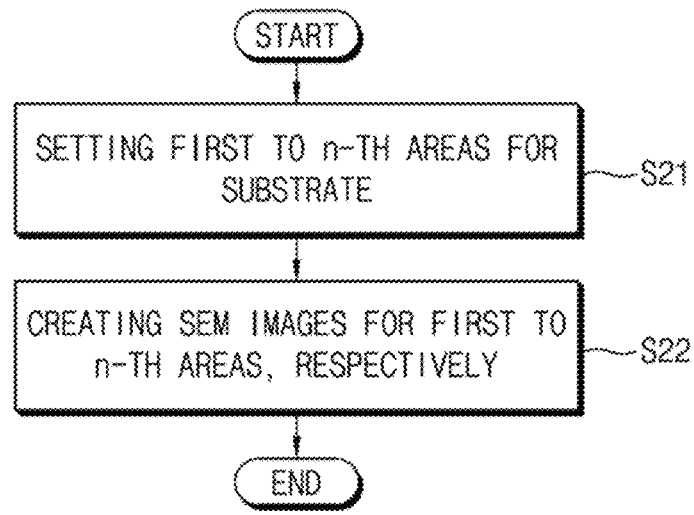
FIG. 3 is a flowchart of a method for creating a plurality of scanning electron microscope (SEM) images for a substrate in accordance with an exemplary embodiment of the disclosure.
Figure 4:
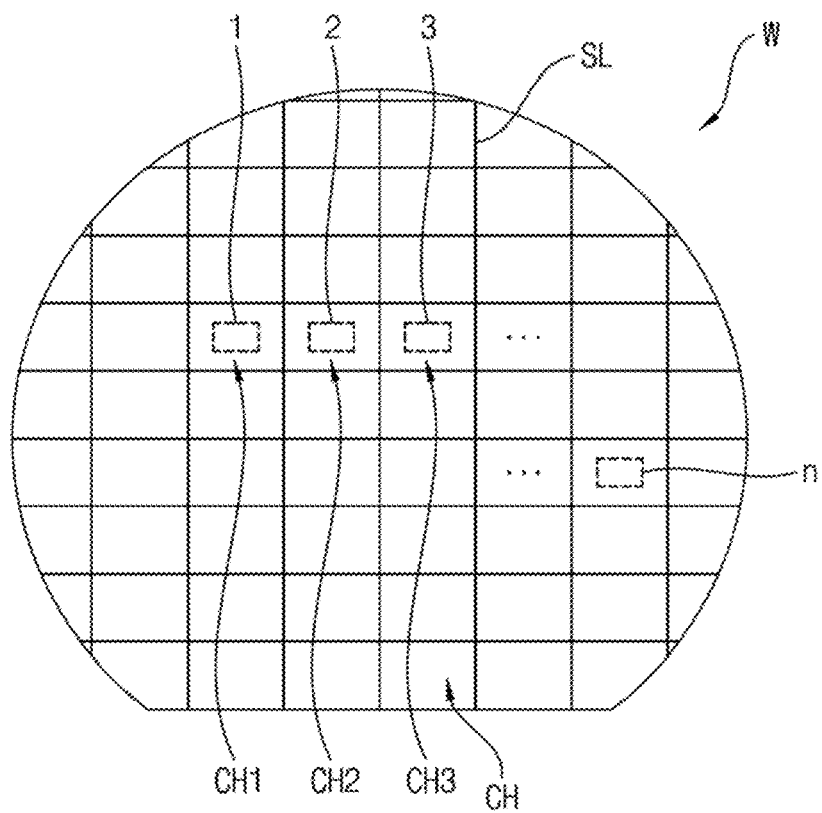
FIG. 4 is a plan view of a substrate.
Figure 5:
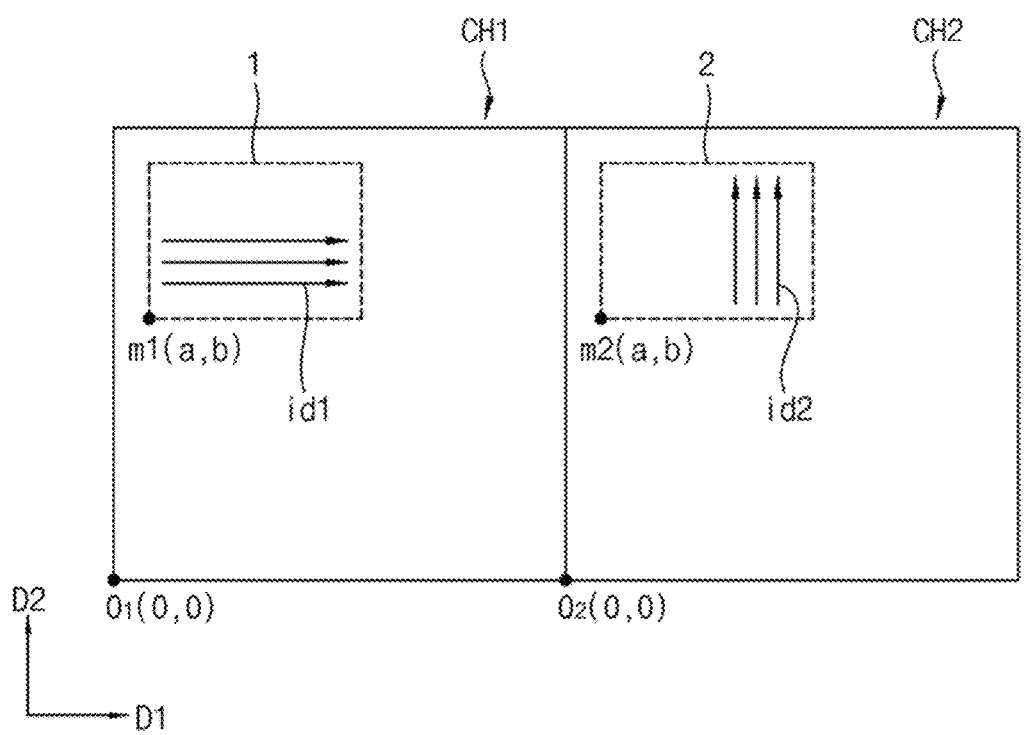
FIG. 5 is an enlarged view of a first chip area and a second chip area in a substrate.
Figure 6:
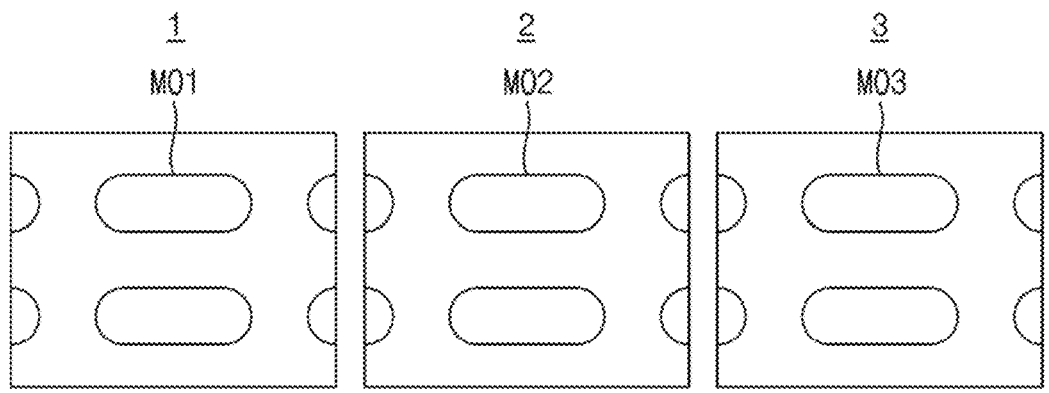
FIG. 6 shows enlarged views of the first chip area, the second chip area and a third chip area in a substrate of FIG. 4.
Figure 7:
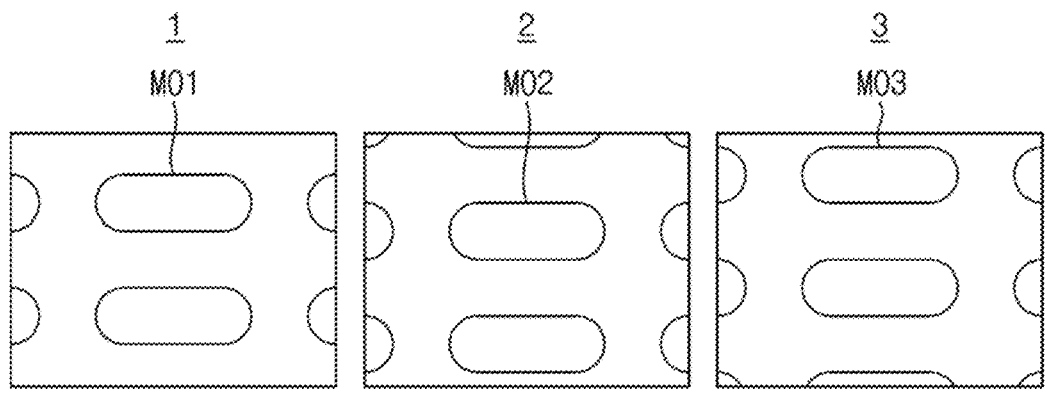
FIG. 7 shows enlarged views of the first chip area, the second chip area and the third chip area in the substrate of FIG. 4.
Figure 8:
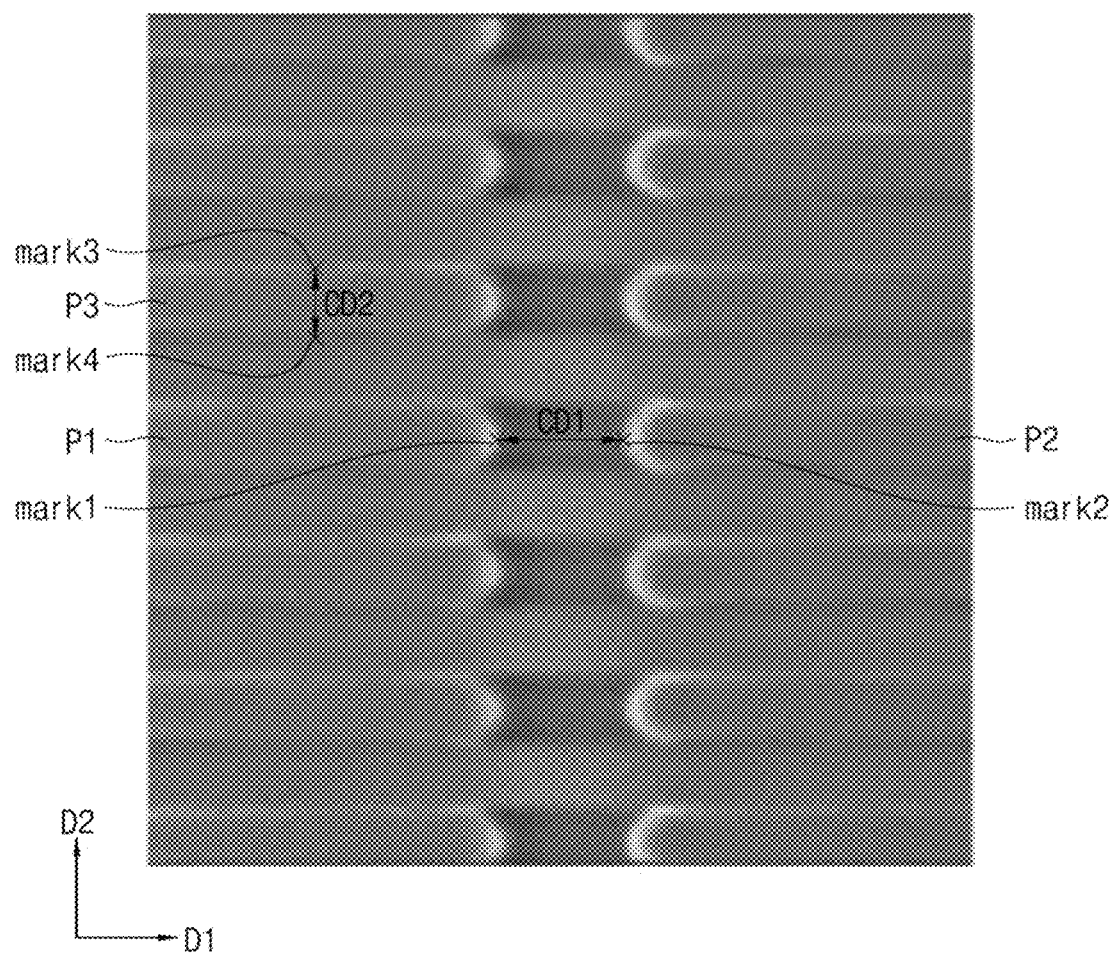
FIG. 8 is a merged image according to an exemplary embodiment of the disclosure.

FIG. 1 is a block diagram of a critical dimension (CD) measurement system according to an exemplary embodiment of the disclosure. FIG. 2 is a flowchart of a method for measuring a CD through a CD measurement system according to an exemplary embodiment of the disclosure. FIG. 3 is a flowchart of a method for creating a plurality of scanning electron microscope (SEM) images for a substrate in accordance with an exemplary embodiment of the disclosure. FIG. 4 is a plan view of a substrate. FIG. 5 is an enlarged view of a first chip area and a second chip area in a substrate. FIG. 6 shows enlarged views of the first chip area, the second chip area and a third chip area in a substrate of FIG. 4. FIG. 7 shows enlarged views of the first chip area, the second chip area and the chip third area in a substrate of FIG. 4. FIG. 8 is a merged image according to an exemplary embodiment of the disclosure.

Referring to FIG. 1, according to an exemplary embodiment, a CD measurement system 10 includes a pattern creating device 100 and a CD measurement device 200. The CD measurement device 200 includes an image creating unit 210, an image merging unit 220, and a CD measurement unit 230.

Referring to FIGS. 1, 2 and 4, according to an exemplary embodiment, the pattern creating device 100 forms patterns in a substrate W (S10). For example, the substrate W may be a semiconductor substrate such as a wafer or a reticle. For example, the pattern creating device 100 can form patterns by etching the substrate W, or can form patterns by etching or light-exposing a material formed on the substrate W. For example, the pattern creating device 100 includes at least one of etching equipment, deposition equipment or light exposure equipment, without being limited thereto.

According to an exemplary embodiment, the patterns include a semiconductor pattern formed by etching the substrate W and/or a material film pattern formed on the substrate W. The material film pattern can include various material film patterns, such as a photoresist pattern, a conductive film pattern that serves as a channel for an electrical signal, or an insulating film that insulates a conductive film pattern from other conductive patterns. The material film pattern is formed on a lower film of the substrate. The lower film includes at least one of a semiconductor layer, an insulating film, a conductive film, or a hard mask film, etc.

According to an exemplary embodiment, the substrate W includes a plurality of chip areas CH divided by scribe lanes SL. The chip area CH is where a semiconductor device is formed. The semiconductor pattern or the material film pattern is formed in the chip area CH.

According to an exemplary embodiment, the patterns are formed in the chip areas CH such that the patterns are identical on a chip area basis. That is, the patterns formed in respective chip areas CH are substantially identical in terms of size, shape and arrangement, and relative positions thereof in respective chip areas CH are substantially identical. For example, patterns in a first chip area CH1 of the substrate W are identical to patterns in a second chip area CH2 of the substrate W. Patterns in a third chip area CH3 of the substrate W are identical to the patterns in the first chip area CH1 and the patterns in the second chip area CH2. The first to third chip areas CH1, CH2 and CH3 may be any different chip areas in the substrate W.

According to an exemplary embodiment, the substrate W that includes the patterns formed by the pattern creating device 100 is provided to the CD measurement device 200. The substrate W that includes the patterns is provided to the image creating unit 210 of the CD measurement device 200. For example, the substrate W is provided to a scanning electron microscope (SEM) of the image creating unit 210.

According to an exemplary embodiment, the image creating unit 210 creates a plurality of SEM images of the substrate W that includes the patterns (S20). The image creating unit 210 includes the scanning electron microscope (SEM), which is an inspection device that uses an electron beam. For example, the SEM includes an electron beam source that generates an electron beam, an electromagnetic lens that focuses the electron beam, a stage on which an object to be inspected is disposed, etc. When the substrate W that includes the patterns is provided to the SEM, the image creating unit 210 scans the substrate W through the SEM by controlling the SEM, and creates an SEM image. In an embodiment, the SEM is an external device separate from the CD measurement device 200.

According to an exemplary embodiment, the SEM scans the substrate W by irradiating at least some of the areas of the substrate W with primary electrons, and then detect secondary electrons emitted or reflected from the substrate W and acquires image data of the patterns. For example, the secondary electrons are those ionized from atoms of the substrate W by the primary electrons. The secondary electrons have energy that varies in accordance with a shape of a surface of the substrate W or the patterns of the substrate. For example, secondary electrons generated at an inclined surface of a pattern have a higher energy than secondary electrons generated at a top surface of the pattern, and secondary electrons generated at an edge region of the pattern have a higher energy than secondary electrons generated at the inclined surface of the pattern. An electron signal is generated that has an intensity that varies in accordance with an energy level of a secondary electron emitted or reflected at an intensity that varies depending upon the shape of the pattern. The SEM detects the generated electron signal, amplifies the detected electron signal, and converts the amplified electron signal into image data of the pattern, that is, an SEM image.

Referring to FIGS. 1 to 4, in an embodiment, the creation of the plurality of SEM images of the substrate W by the image creating unit 210 (S20) includes setting first to n-th areas 1, 2, 3, . . . , n in the substrate W (S21), and creating SEM images for the first to n-th areas 1, 2, 3, . . . , n (S22), where n is a natural number greater than 1. Respective positions of the first to n-th areas 1, 2, 3, . . . n shown in FIG. 4 may be any positions, and exemplary embodiments of the disclosure are not limited thereto.

According to an exemplary embodiment, when the substrate W is provided to the image creating unit 210, the image creating unit 210 sets the first to n-th areas 1, 2, 3, . . . , n to be scanned in the substrate W by the SEM (S21). Each of the first to n-th areas 1, 2, 3, . . . , n includes a measurement object. For example, each of the first to n-th areas 1, 2, 3, . . . , n includes at least one pattern to be used for CD measurement or includes a part of a plurality of patterns to be used for CD measurement. The image creating unit 210 sets the first to n-th areas 1, 2, 3, . . . , n in accordance with an external input signal, or determines the first to n-th areas 1, 2, 3, . . . , n in accordance with a previously stored selection signal.

Referring to FIG. 4, in an embodiment, the first to n-th areas 1, 2, 3, . . . , n are different areas in the substrate W. The first to n-th areas 1, 2, 3, . . . n are areas that do not overlap on the substrate W. For example, the first area 1 and the second area 2 are different areas on the substrate W, and the third area 3 is an area on the substrate W different from the first area 1 and the second area 2. The first to n-th areas 1, 2, 3, . . . , n are spaced apart from one another on the substrate W.

In an embodiment, the first to n-th areas 1, 2, 3, . . . , n are disposed in different chip areas CH in the substrate W. The substrate W includes a plurality of chip areas CH separated by scribe lanes SL, and the first to n-th areas 1, 2, 3, . . . , n are included in different chips areas of the plurality of chip areas CH. For example, the first area 1 is a portion of the first chip area CH1, the second area 2 is a portion of the second chip area CH2, and the third area 3 is a portion of the third chip area CH3. When a pattern is excessively irradiated by an electron beam of the SEM, the pattern may be damaged. To this end, in accordance with exemplary embodiments of the disclosure, a plurality of SEM images are acquired from several spaced apart areas to minimize damage to the pattern by the electron beam of the SEM.

Referring to FIGS. 4 and 5, in an embodiment, relative positions of the first to n-th areas 1, 2, 3, . . . , n in the chip areas CH where the first to n-th areas 1, 2, 3, . . . , n are disposed, respectively, are identical. For example, letting a first point $O_1$ in the first chip area CH1 be a reference point whose coordinates thereof are (0,0), the coordinates of a first vertex m1 in the first area 1 are (a,b). In this case, letting a second point $O_2$ in the second chip area CH2 that corresponds to the first point $O_1$ be a reference point (0,0), the coordinates of a second vertex m2 in the second area 2 that corresponds to the first vertex m1 of the first area 1 are (a,b).

Referring to FIGS. 4 and 6, in an embodiment, the first to n-th areas 1, 2, 3, . . . , n (in the drawings, only 3 areas (n=3) are shown) set by the image creating unit 210 include identical patterns. That is, the patterns respectively included in the first to n-th areas 1, 2, 3, . . . , n are identical in terms of number, shape, size, arrangement, etc. For example, the first to third areas 1, 2 and 3 include measurement objects MO1, MO2 and MO3 to be measured for CDs thereof, respectively.

Referring to FIGS. 4 and 7, in an embodiment, the first to n-th areas 1, 2, 3, . . . , and n (in the drawings, only 3 areas (n=3) are shown) set by the image creating unit 210 include identical patterns, but the numbers and/or arrangements of the patterns included therein are different. In this case, the first to third areas 1, 2 and 3 include measurement objects MO1, MO2 and MO3 to be measured for CDs thereof, respectively, similar to the previous case. That is, each of the first to n-th areas 1, 2, 3, . . . , n includes at least one of the identical patterns.

According to an exemplary embodiment, after setting the first to n-th areas 1, 2, 3, . . . , n, the image creating unit 210 scans each of the set first to n-th areas 1, 2, 3, . . . , n, thereby creating SEM images for the first to n-th areas 1, 2, 3, . . . , n, respectively (S22). That is, the image creating unit 210 creates first to n-th images for the first to n-th areas 1, 2, 3, . . . , n, respectively. That is, the image creating unit 210 creates a total of n SEM images. For example, "n" as described above may be about 10 to 13. That is, the image creating unit 210 creates 10 to 13 SEM images, but exemplary embodiments of the disclosure are not limited thereto. Each of the first to n-th areas 1, 2, 3, . . . , n has a shape such as a rectangular shape or a circular shape, etc., and have the same shape and size.

Referring to FIG. 5, in an embodiment, when the image creating unit 210 creates respective SEM images for the first to n-th areas 1, 2, 3, . . . , n, the SEM scans the substrate while moving an electron beam in one direction. Here, the movement direction of the electron beam is referred to as a "scanning direction". For example, the SEM scans the substrate while irradiating the electron beam in a first direction D1. That is, the SEM scans the substrate as indicated by first lines id1 shown in FIG. 5. In this case, the scanning direction is the first direction D1. Alternatively, the SEM can scan the substrate while irradiating the electron beam in a second direction D2 that crosses the first direction D1. That is, the SEM scans the substrate as indicated by second lines id2 shown in FIG. 5. In this case, the scanning direction is a second direction D2. The scanning direction may be changed by adjusting the movement direction of the electron beam, or by rotating the substrate while maintaining the movement direction of the electron beam.

According to an exemplary embodiment, the image creating unit 210 scans each of the first to n-th areas 1, 2, 3, . . . , n by irradiating each of the first to n-th areas 1, 2, 3, . . . , n with the electron beam while adjusting the scanning direction of each of the first to n-th areas 1, 2, 3, . . . , n. In an embodiment, the SEM scans each of the first to n-th areas 1, 2, 3, . . . , n in the same direction. For example, the SEM scans each of the first to n-th areas 1, 2, 3, . . . , n in the first direction D1. Alternatively, the SEM scans each of the first to n-th areas 1, 2, 3, . . . , n in the second direction D2. However, exemplary embodiments of the disclosure are not limited to the conditions described above, and each the first to n-th areas 1, 2, 3, . . . , n may be scanned in a same direction that is different from the first direction D1 and the second direction D2.

In an embodiment, the image creating unit 210 sets, through the SEM, the scanning direction to one direction for some of the first to n-th areas 1, 2, 3 . . . . , n, and sets the scanning direction to another direction different from the one direction for a remainder of the first to n-th areas 1, 2, 3, . . . , n. For example, the image creating unit 210 sets the scanning direction to the first direction D1 for some the first to n-th areas 1, 2, 3, . . . , n while setting the scanning direction to the second direction D2 for s remainder of the first to n-th areas 1, 2, 3, . . . , n. For example, the first direction D1 and the second direction D2 may be perpendicular to each other. For example, when creating SEM images for the first to tenth areas, the image creating unit 210 sets the scanning direction to the first direction D1 for the first to fifth areas and sets the scanning direction to the second direction D2 for the sixth to tenth areas.

In an embodiment, the SEM creates respective SEM images for the first to n-th areas 1, 2, 3, . . . , n under the same condition. That is, the SEM scans the first to n-th areas 1, 2, 3, . . . , n under the same condition. Here, the same condition includes all properties, such as brightness, contrast, magnification, pixel size, etc., except for scanning direction.

In an embodiment, the image creating unit 210 forms a plurality of SEM images using the substrate, and then provides the substrate again to the pattern creating device 100.

Referring to FIGS. 1 and 2 again, in an embodiment, after the image creating unit 210 forms a plurality of SEM images, the image merging unit 220 creates a merged image (S30). In an embodiment, the image merging unit 220 receives a plurality of SEM images from the image creating unit 210, and merges the received SEM images and creates a merged image. The image creating unit 210 forms respective SEM images for the first to n-th areas 1, 2, 3, . . . , n, and provides the SEM images to the image merging unit 220. The image merging unit 220 overlaps pixels that constitute the SEM images, thereby creating a merged image. For example, the image merging unit 220 aligns the SEM images such that pattern images for measurement objects in respective SEM images completely overlap. Here, a pattern image is an image of an actual pattern or a measurement object on the substrate that is included in an SEM image. Referring to FIGS. 6 and 7, the image merging unit 220 aligns SEM images such that pattern images for respective measurement objects MO1, MO2 and MO3 completely overlap. Even when the patterns in respective SEM images are different, as shown in FIG. 7, the image merging unit 220 can select pattern images for the measurement objects MO1, MO2 and MO3 from respective SEM images, and align the selected pattern images to completely overlap each other, thereby creating a merged image. Aligning the pattern images includes setting reference points for respective pattern images, and aligning the reference points so that they overlap. In an embodiment, the image merging unit 220 creates a merged image by processing SEM images provided thereto such that the SEM images become mergeable, and merging the processed images.

In an embodiment, the image merging unit 220 generates electron signals that respectively correspond to the SEM images provided thereto, on the basis of the provided SEM images, merges the generated electron signals, and creates a merged image on the basis of the merged electron signals. For example, the image merging unit 220 extracts first to n-th signals from the first to n-th images, respectively, and merges the first to n-th signals, thereby creating a merged image through the merged signals.

In an embodiment, the image merging unit 220 receives electron signals from the image creating unit 210, merges the received electron signals, and creates a merged image through the merged electron signals. The image creating unit 210 acquires electron signals for creating SEM images by scanning the first to n-th areas 1, 2, 3, . . . , n using the SEM. For example, the image creating unit 210 acquires a first electron signal by scanning the first area, and acquires a second electron signal by scanning the second area. The image creating unit 210 stores electron signals (first to n-th signals) respectively acquired by scanning the first to n-th areas, and provides the stored electron signals to the image merging unit 220. Alternatively, the image creating unit 210 provides to the image merging unit 220 a current signal acquired every time an electron signal is obtained by scanning of each of the first to n-th areas 1, 2, 3, . . . , n. The image merging unit 220 merges the received electron or current signals, and creates a merged image on the basis of the resultant merged electron or current signals.

In an embodiment, the merged image has higher resolution than each of the SEM images for the first to n-th areas 1, 2, 3, . . . , n. FIG. 8 shows that the merged image has higher resolution than SEM images before merging. As described above, the SEM irradiates the substrate with primary electrons, and creates an SEM image from electron signals according to secondary electrons generated by the interaction between the primary electrons and the substrate. That is, the process of creating an SEM image includes estimating states of electrons through a statistical distribution. Here, a volatility of the electron distribution is reduced as the quantity of electrons increases. As volatility of the electron distribution is reduced, the resolution of an SEM image is increased. Accordingly, as the quantity of electrons used to form an SEM image increases, the resolution of the SEM image increases. Exemplary embodiments of the disclosure are based on the principle as described above. That is, since electron signals are merged to create a merged image, so that the number of electrons used to form a merged image is greater than the number of electrons used to form an SEM image. As a result, the resolution of the merged image is higher than the resolution of the SEM image. In addition, even when a merged image is created by aligning pixels of SEM images, the number of electrons used to form the merged image increases because the pixels of each SEM image correspond to an electron signal, and the resolution of the merged image is higher than the resolution of the SEM image.

In an embodiment, the CD measurement unit 230 measures a CD on the basis of the merged image (S40). The CD is measured by the CD measurement unit 230 on the basis of the merged image. Measuring the CD includes recognizing a pattern image for a measurement object in the merged image by the CD measurement unit 230, and forming, by the CD measurement unit 230 on the pattern image, marks for CD measurement. The CD measurement unit 230 forms marks in an edge area of the pattern image in the merged image. The CD measurement unit 230 measures a CD by measuring the distance between the marks.

Referring to FIG. 8, for example, in an embodiment, to measure a first CD CD1 between a first pattern image P1 and a second pattern image P2, the CD measurement unit 230 recognizes the first pattern image P1 and the second pattern image P2 in the merged image, forms a first mark mark1 on an edge of the first pattern image P1, and forms a second mark mark2 on an edge of the second pattern image P2. The CD measurement unit 230 measures the first CD CD1 between the first pattern image P1 and the second pattern image P2 by measuring the distance between the first mark mark) and the second mark mark2. For another example, to measure a second CD CD2 of a third pattern image P3, the CD measurement unit 230 recognizes the third pattern image P3 in the merged image, and forms a third mark mark3 and a fourth mark mark4 on an edge of the third pattern image P1. The CD measurement unit 230 measures the second CD CD2 by measuring the distance between the third mark mark3 and the fourth mark mark4. Pattern images recognized by the CD measurement unit 230 and positions of marks formed on the pattern images can be determined in accordance with an external input signal. Alternatively, pattern images recognized by the CD measurement unit 230 and positions of marks formed on the pattern images can be determined in accordance with a previously stored setting signal.

In an embodiment, the CD measurement unit 230 can measure a CD in any direction, irrespective of the scanning direction when SEM images are formed. In an embodiment, CD measurement includes measuring a CD in a direction that perpendicularly intersects the scanning direction. For example, when the image creating unit 210 forms SEM images by scanning each of the first to n-th areas 1, 2, 3, . . . , n in the first direction D1, the CD measurement unit 230 can measure a CD in the second direction D2. Since CD measurement is performed using the merged image, which has enhanced resolution, an accurate CD measurement can be achieved even when a CD is measured in a direction different from the scanning direction.

Figure 9:
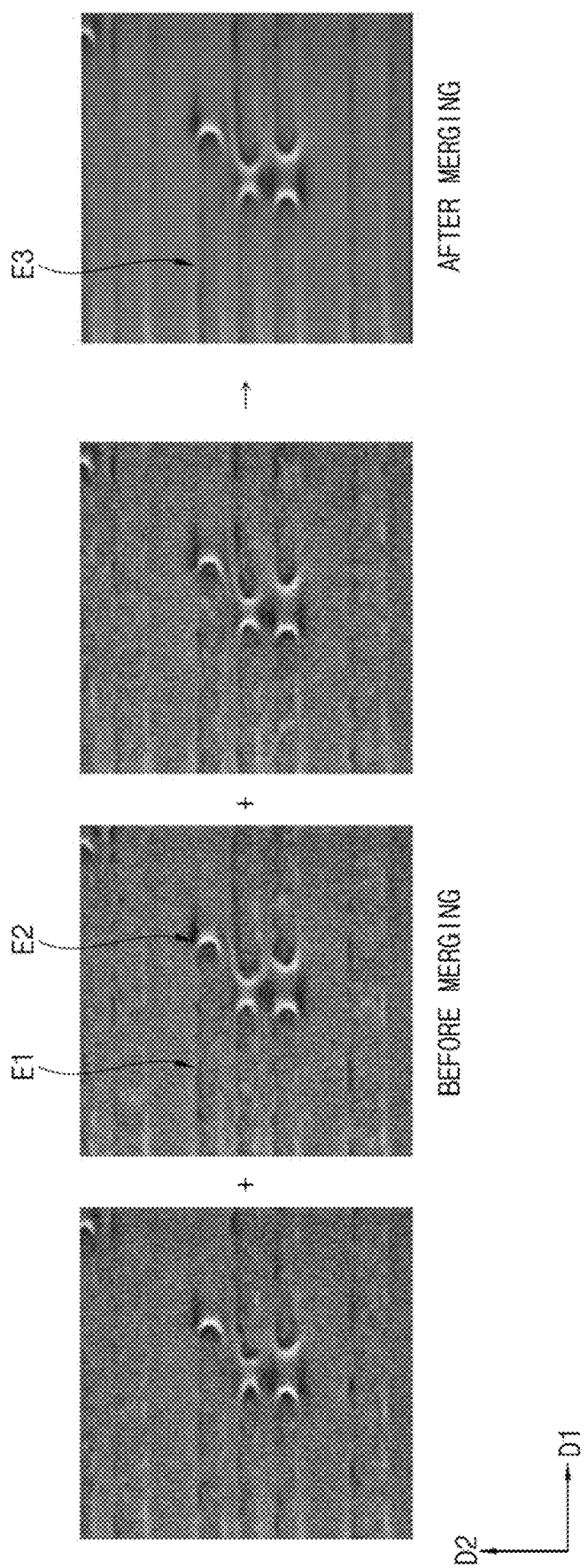
FIG. 9 shows SEM images before merging and a merged image created through merging of the SEM images in accordance with an exemplary embodiment of the disclosure.

FIG. 9 shows SEM images before merging and a merged image created by merging the SEM images in accordance with an exemplary embodiment of the disclosure. Referring to FIG. 9, the SEM images before merging are created by scanning in the first direction D1. FIG. 9 shows that, in the SEM images, pattern edges E1 that extend in the first direction D1 identical to the scanning direction are dim, and pattern edges E2 that extend in the second direction D2 perpendicular to the scanning direction are distinct. In these SEM images, in a conventional case, an accurate CD measurement might not be achieved when a CD is measured in the second direction D2 using pattern edges E1. Furthermore, when, marks for CD measurement are indicated on edges of a measurement object, and a CD is measured through the distance between the marks, the marks may be incorrectly indicated on pattern edges due to low resolution of an SEM image. In this case, for each SEM image, a person can directly correct the marks for CD measurement. However, in exemplary embodiments of the disclosure, CD measurement is performed using a merged image that has enhanced resolution, which enhances accuracy of CD measurement, and thus it is not necessary to manually correct errors. Even when error correction is required, human involvement is reduced because error correction is performed only once for a merged image. As can be seen from the merged image, a pattern edge E3 that extends in the same direction as the scanning direction has enhanced resolution, and thus an accurate DC measurement can be achieved not only by measuring a CD in the same direction as the scanning direction, but also by measuring a CD in a direction perpendicular to the scanning direction.

Figure 10:
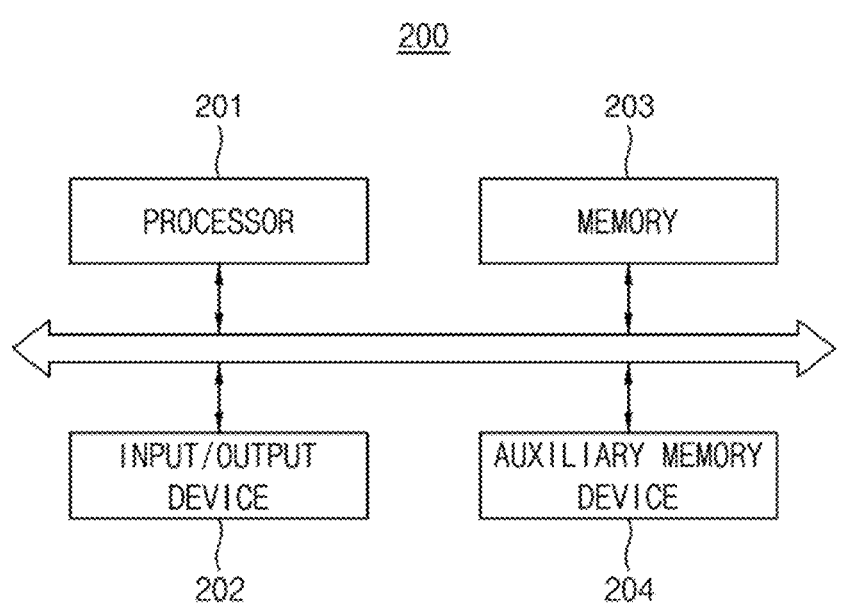
FIG. 10 is a block diagram of a CD measurement device according to an exemplary embodiment of the disclosure.

FIG. 10 is a block diagram of a CD measurement device according to an exemplary embodiment of the disclosure.

Referring to FIG. 10, in an embodiment, a CD measurement device 200 includes a processor 201, an input/output device 202, and a memory 203. The CD measurement device 200 may further include an auxiliary memory device 204. The input/output device 202, the processor 201, the memory 203 and the auxiliary memory device 204 are interconnected via a bus, and the processor 201 controls the input/output device 202, the memory 203 and the auxiliary memory device 204.

In an embodiment, the processor 201 performs operations that drive the CD measurement device 200. The processor 201 performs various processing operations associated with operating the measuring a CD. The processor 201 implements a CD measurement method according to an exemplary embodiment of the disclosure by executing a control program stored in the memory 203. In an embodiment, each of the image creating unit 210, the image merging unit 220, and the CD measurement unit 230 is embodied in the processor 201 and the memory 203. In an embodiment, the processor 201 is a multi-core environment that includes a plurality of cores. For example, the processor 201 may be one of a central processing unit (CPU), a graphics processing unit (GPU), or an application processor (AP), but exemplary embodiments of the disclosure are not limited thereto.

The memory 203 may be a volatile memory such as a static random access memory (SRAM) or a dynamic random access memory (DRAM), or a non-volatile memory such as a PRAM, an MRAM, a ReRAM, an FRAM, or a NOR flash memory, etc.

In an embodiment, an input unit in the input/output device 202 can be manipulates by the user. For example, the input unit may include a keyboard, an operation panel, or various readers. An output unit of the input/output device 202 may include a monitor, a printer, a recorder, etc. SEM images and a merged image formed in accordance with a CD measurement method according to embodiments of the disclosure can be displayed to the user through the output unit.

The auxiliary memory device 204 is a storage medium for the CD measurement device 200. The auxiliary memory device 204 stores application programs and various data items. The auxiliary memory device 204 may be a memory card, such as an MMC, an eMMC, an SD, or an microSD, etc., or a hard disk drive (HDD). The auxiliary memory device 204 may include a NAND flash memory that has a large storage capacity. Alternatively, the auxiliary memory device 204 may include a next-generation non-volatile memory such as a PRAM, an MRAM, a ReRAM, an FRAM, etc. or a NOR flash memory.

In accordance with exemplary embodiments of the disclosure, an SEM image can be acquired that has enhanced resolution, and enhanced accuracy can be achieved when measuring a CD in the SEM image. In addition, human involvement is reduced when measuring a CD. Furthermore, an SEM image can be acquired that has enhanced resolution without damaging a substrate or breaking the substrate while acquiring the SEM image.

While embodiments of the disclosure have been described with reference to the accompanying drawings, it should be understood by those skilled in the art that various modifications may be made without departing from the scope of embodiments of the disclosure and without changing essential features thereof. Therefore, the above-described embodiments should be considered in a descriptive sense only and not for purposes of limitation.

What is claimed is:

1. A method of measuring a critical dimension (CD), comprising the steps of:
    forming a plurality of patterns in a substrate;
    creating first to n-th images, wherein n is a natural number greater than 1, for first to n-th areas in the substrate, respectively, wherein the first to n-th areas do not overlap with each other, wherein each of the first to n-th areas includes at least some of the plurality of patterns;
    creating a merged image from the first to n-th images; and
    measuring a CD of a measurement object from the plurality of patterns using the merged image,
    wherein the merged image has a higher resolution than each of the first to n-th images.

2. The method according to claim 1, wherein:
    creating the first to n-th images comprises scanning each of the first to n-th areas using a scanning electron microscope in a first scanning direction; and
    measuring the CD comprises measuring the CD of the measurement object in a second direction.

3. The method according to claim 2, wherein the second direction is perpendicular to the first direction.

4. The method according to claim 1, wherein:
    creating the first to n-th images comprises:
        scanning some of the first to n-th areas using a scanning electron microscope in a first scanning direction, and
        scanning a remainder of the first to n-th areas using the scanning electron microscope in a second scanning direction; wherein
    the first scanning direction and the second scanning direction are perpendicular to each other.

5. The method according to claim 1, wherein creating the first to n-th images comprises respectively scanning the first to n-th areas using a scanning electron microscope under a same condition.

6. The method according to claim 5, wherein the same condition comprises magnification, brightness, and pixel size.

7. The method according to claim 1, wherein;
    the substrate comprises a plurality of chip areas separated by a scribe lane; and
    the first to n-th areas are formed in different chip areas, respectively.

8. The method according to claim 7, wherein respective relative positions of the first to n-th areas in the different chip areas are identical.

9. The method according to claim 1, wherein each of the first to n-th areas comprises at least one same pattern as remaining first to n-th areas.

10. The method according to claim 1, wherein the n is from 10 to 13.

11. The method according to claim 1, wherein creating the merged image comprises:
    extracting first to n-th signals from the first to n-th images, respectively;
    merging the first to n-th signals to generate a merged signal; and
    creating a merged image through the merged signal.

12. The method according to claim 1, wherein creating the merged image comprises:
    storing first to n-th signals generated when creating the first to n-th images, respectively;
    merging the stored first to n-th signals wherein a merged signal is created; and
    creating a merged image from the merged signal.

13. The method according to claim 1, wherein creating the merged image comprises:
processing the first to n-th images into first to n-th mergeable images, respectively; and
merging the first to n-th mergeable images wherein a merged image is created.

14. The method according to claim 1, wherein creating the merged image comprises aligning pixels that respectively constitute the first to n-th images.

15. The method according to claim 14, wherein creating the merged image comprises:
selecting pattern images for the measurement Object from the first to n-th images, respectively; and
aligning the pattern images.

16. The method according to claim 15, wherein aligning the pattern images comprises:
setting reference points for the pattern images, respectively; and
aligning the reference points wherein the reference points overlap.

17. A method of measuring a critical dimension (CD), comprising the steps of:
forming a plurality of patterns in a substrate;
creating first to n-th images, wherein n is a natural number greater than 1, for first to n-th areas in the substrate, respectively, wherein the first to n-th areas do not overlap with each other, wherein each of the first to n-th areas comprises at least some of the plurality of patterns;
creating a merged image from the first to n-th images; and
measuring a CD for a measurement object from the plurality of patterns using the merged image,
wherein creating the first to n-th images comprises scanning each of the first to n-th areas using a scanning electron microscope in a first scanning direction,
wherein measuring the CD comprises measuring the CD for the measurement object in a second direction,
wherein the substrate comprises a plurality of chip areas separated by a scribe lane,
wherein the first to n-th areas are comprised of different chip areas, respectively,
wherein the merged image has higher resolution than each of the first to n-th images.

18. The CD measurement method according to claim 17, wherein respective relative positions of the first to n-th areas in the different chip areas are identical.

19. The CD measurement method according to claim 17, wherein creating the first to n-th images comprises respectively photographing the first to n-th areas using a scanning electron microscope under a same condition.

20. A method for measuring a critical dimension (CD), comprising the steps of:
forming a plurality of patterns in a substrate;
creating first to n-th images, wherein is a natural number greater than 1, for first to n-th areas in the substrate, respectively, wherein the first to n-th areas do not overlap with each other, wherein each of the first to n-th areas comprises at least some of the plurality of patterns;
creating a merged image from the first to n-th images; and
measuring a CD for a measurement object from the plurality of patterns using the merged image,
wherein the substrate comprises a plurality of chip areas separated by a scribe lane,
wherein respective relative positions of the first to n-th areas in the different chip areas are identical,
wherein the first to n-th areas are comprised of different chip areas, respectively;
wherein the merged image has higher resolution than each of the first to n-th images.

* * * * *